CLASS B AMPLIFIER CIRCUIT

Filed March 22, 1966 3 Sheets-Sheet 1

INVENTOR
LORIMER K. HILL

E. Mickey Hubbard
ATTORNEY

Sept. 15, 1970 L. K. HILL 3,529,254

CLASS B AMPLIFIER CIRCUIT

Filed March 22, 1966 3 Sheets-Sheet 2

INVENTOR
LORIMER K. HILL

E. Mickey Hubbard
ATTORNEY

INVENTOR
LORIMER K. HILL
E. Mickey Hubbard
ATTORNEY

United States Patent Office 3,529,254
Patented Sept. 15, 1970

3,529,254
CLASS B AMPLIFIER CIRCUIT
Lorimer K. Hill, Richardson, Tex., assignor to Texas Instruments Incorporated, Dallas, Tex., a corporation of Delaware
Filed Mar. 22, 1966, Ser. No. 536,405
Int. Cl. H03f 3/26
U.S. Cl. 330—15 3 Claims

ABSTRACT OF THE DISCLOSURE

Disclosed are amplifier circuits having a pair of complementary output transistors with their emitter electrodes interconnected and D.C. connected to the output circuit of the amplifier; and having a pair of emitter-follower input transistors with their base electrodes interconnected and D.C. connected to the input circuit of the amplifier; and wherein the NPN emitter-follower input transistor drives the PNP output transistor while the PNP emitter-follower input transistor drives the NPN output transistor; and whereby the base-emitter voltages of the emitter-follower input transistors respectively bias the complementary output transistors at different levels when no signal is applied to the input circuit of the amplifier so as to respectively cause the complementary output transistors to conduct in their linear regions.

This invention relates generally to amplifiers, and more particularly relates to complementary class B circuits.

Ideally, class B circuits are characterized by having zero output current in the absence of an input signal, and high bipolar output current when an input signal is applied. One type of class B amplifier utilizes a complementary pair of output transistors, the emitters of which are common and are the output of the amplifier, and the bases of which are the input. Ideally, only one of the transistors conducts at any one time, depending upon the polarity of the input voltage signal. This type of circuit usually suffers from excessive crossover distortion because each of the transistors remains essentially off until its base voltage reaches some significant finite level. This results in a dead spot at the crossover point between positive and negative signals and thus the term crossover distortion. Various circuits have been proposed for biasing the bases of the transistors in an effort to operate the transistors in the linear region under no signal conditions. Theoretically this results in idle currents through the two transistors, without producing an output current, and substantially eliminates the crossover distortion. Another problem with this type of amplifier is temperature stability. Under heavy load conditions, a high current through the transistors will reduce the $V_{BE}$ of the conducting transistor, thereby tending to increase the current. It is possible for this to result in a thermal runaway. The various circuits heretofore proposed which use an idle current through the transistors to reduce crossover distortion have in general suffered from inadequate temperature compensation and therefore temperature instability and from excessive idle current through the transistor that is not driving the load. Also, the circuits usually use a high impedance signal source to drive the output transistors with the result that the collector-base leakage current tends to forward bias the base-emitter junction and increase the output of the transistor.

Therefore, an important object of this invention is to provide an improved class B amplifier circuit.

Another object is to provide a class B circuit that is stable over a wide temperature range.

Yet another object is to provide a class B circuit which has a minimum of crossover distortion.

A further object is to provide such a circuit which is stable over wide signal excursions without excessive idle current.

Another object is to provide such a circuit that is particularly suited for fabrication as an integrated circuit.

These and other objects are accomplished in accordance with the present invention by a circuit having a complementary pair of output transistors the emitters of which are interconnected and form the output of the circuit. The collectors of the output transistors are connectable to separate voltage supplies. The base of each output transistor is driven by an emitter-follower transistor of the opposite type. The bases of the two emitter-follower transistors are interconnected and form the input to the amplifier. As a result, the bases of the two complementary output transistors are biased to different levels under no signal conditions, the levels being related to the sum of the $V_{BE}$'s of the emitter-follower transistors. As a result, the output transistors are operated in the linear region even in the absence of an input signal. By placing the four transistors in good heat exchange relationship, thermal stability is achieved.

In accordance with another important aspect of the invention, a voltage source is connected between the bases of the emitter-follower transistors so that the voltage levels of the bases of the output transistors can be optimized. In a specific embodiment of the invention, the voltage source comprises a resistor connected between the bases and between a current source and a current sink. The current source may either be passive or active with respect to the input signal.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
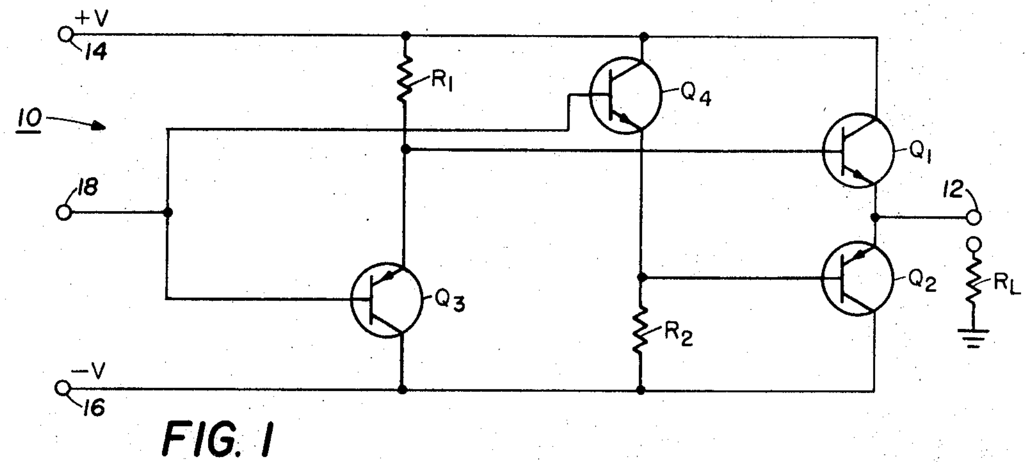
FIG. 1 is a schematic circuit diagram of an amplifier circuit constructed in accordance with the present invention.

Referring now to the drawings, and in particular to FIG. 1, an amplifier circuit in accordance with the present invention is indicated generally by the reference numeral 10. The amplifier 10 is comprised of a complementary pair of output transistors $Q_1$ and $Q_2$ the emitters of which are common and form the output 12 of the amplifier. The collector of NPN transistor $Q_1$ is connected to a positive voltage supply terminal 14, and the collector of PNP transistor $Q_2$ is connected to a negative voltage supply terminal 16. The base of transistor $Q_1$ is biased by an emitter-follower PNP transistor $Q_3$, and the base of transistor $Q_2$ is biased by an emitter-follower NPN transistor $Q_4$. The emitter of transistor $Q_3$ is connected through a resistor $R_1$ to the positive voltage supply terminal 14, and the collector is connected to the negative voltage supply terminal 16. Similarly, the emitter of transistor $Q_4$ is connected through resistor $R_2$ to the negative voltage supply terminal 16 and the collector is connected to the positive voltage supply terminal 14. The bases of the emitter-follower transistors $Q_3$ and $Q_4$ are common and are connected to the input terminal 18 of the amplifier circuit 10.

The $V_{BE}$ characteristics of the NPN transistors $Q_1$ and $Q_4$ are preferably substantially matched as are the $V_{BE}$ characteristics of the PNP transistors $Q_2$ and $Q_3$, and the $V_{BE}$ characteristics of the PNP and NPN transistors are preferably matched as well as possible. Resistors $R_1$ and $R_2$ may have the same or different values, depending upon the desired load voltage and current and the minimum $h_{FE}$ of transistors $Q_1$ and $Q_2$. Using two power supplies, the following equation provides the value for $R_1$, neglecting saturation voltage:

$$R_1=(1+h_{FE})\left(\frac{V_{CC}-V_{BE}}{I_L}-R_L\right)$$

wherein $h_{FE}$ is for transistor $Q_1$, $V_{CC}$ is the positive voltage $+V$, $V_{BE}$ is for transistor $Q_1$, $R_L$ is the impedance of the load connected to the output terminal 12, and $I_L$ is the current through the load. The value of resistor $R_2$ can be determined using the same equation and substituting the parameter values for the appropriate transistors. It is also desirable for the transistors $Q_1$, $Q_2$, $Q_3$ and $Q_4$ to be located in good heat transfer relationship, preferably on the same heat sink or in the same integated circuit chip.

In the operation of amplifier 10, assume first that no signal is applied to the input terminal 18, i.e., that the input terminal 18 is at ground potential. Assuming also that resistor $R_1$ is equal to resistor $R_2$ and that the base-emitter voltage characteristics of the NPN transistors $Q_1$ and $Q_4$ are identical as are those of the PNP transistors $Q_2$ and $Q_3$, then the base of transistor $Q_1$ will be at a positive potential equal to the base-emitter voltage of transistor $Q_3$ and the base of transistor $Q_2$ will be at a negative voltage equal to the base-emitter voltage of transistor $Q_4$. Thus, if the $V_{BE}$ characteristics of the PNP transistors reasonably match the $V_{BE}$ characteristics of the NPN transistors, the output terminal 12 will also be at ground potential and no current will flow through the load $R_L$. However, each of the output transistors will be biased so as to conduct sufficient idle current to operate in the linear region even when no input signal is present at terminal 18 because of the $V_{BE}$ of transistors $Q_3$ and $Q_4$.

As the input signal at terminal 18 goes positive, the conductance of transistor $Q_4$ increases, thereby decreasing the conductance of transistor $Q_2$ and the conductance of transistor $Q_3$ decreases, thereby increasing the conductance of transistor $Q_1$. As a result, current passes primarily from the positive voltage supply terminal 14 through transistor $Q_1$ and through the load $R_L$. On the other hand, when the input terminal 18 goes negative, the conductance of transistor $Q_4$ is decreased, thereby increasing the conductance of transistor $Q_2$, and the conductance of transistor $Q_3$ is increased, thereby decreasing the conductance of transistor $Q_1$. Current then flows primarily from ground through the load resistor $R_L$ and transistor $Q_2$ to the negative voltage supply terminal 16.

Due to the fact that both transistors $Q_1$ and $Q_2$ are always biased to operate in the linear region by the base-emitter voltage drop of transistors $Q_3$ and $Q_4$, respectively, crossover distortion is substantially eliminated. The circuit 10 is stable over a wide temperature range because a nearly constant idle current is maintained. For example, if the temperature of transistors $Q_1$ or $Q_2$ increases due either to an increase in current or an increase in the ambient, the $V_{BE}$'s of the transistors will decrease and the conductance of the transistors would tend to increase. However, if the temperature of transistors $Q_3$ and $Q_4$ increases by the same amount and the $V_{BE}$ characteristics are reasonably matched, then the potential of the base of transistor $Q_1$ will be lowered and the potential of the base of transistor $Q_2$ will be raised, thus compensating for the decrease in the base-emitter voltages of transistors $Q_1$ and $Q_2$. Temperature stability is further enhanced by the fact that the base-emitter voltages of the emitter-follower transistors $Q_3$ and $Q_4$ are quite predictable because of strong emitter degeneration. Since transistors $Q_1$ and $Q_2$ are driven by low impedance sources, i.e., the emitter-follower transistors $Q_3$ and $Q_4$, the collector-base leakage currents of transistors $Q_1$ and $Q_2$ have negligible effect. Another advantage of the circuit 10 is that at no load condition, the only thing that can change the idle current is a change in the sum of the base-emitter voltages of transistors $Q_3$ and $Q_4$. Because of the exponential characteristic of the base-emitter voltage as a function of the emitter current, the sum will be a maximum near the zero signal bias point and a minimum near the signal extremes. This is a desirable characteristic because the highest idle current is needed at the crossover point in order to minimize distortion.

When the amplifier is fabricated in integrated circuit form, the base-emitter voltage characteristics are even more predictable since similar types of transistors can be made during the same diffusion steps and therefore will have the same impurity concentrations. When the amplifier 10 is fabricated in integrated circuit form, the close thermal coupling forces the base-emitter voltages of the emitter-follower transistors $Q_3$ and $Q_4$ to change as a function of the output power.

Figure 2:
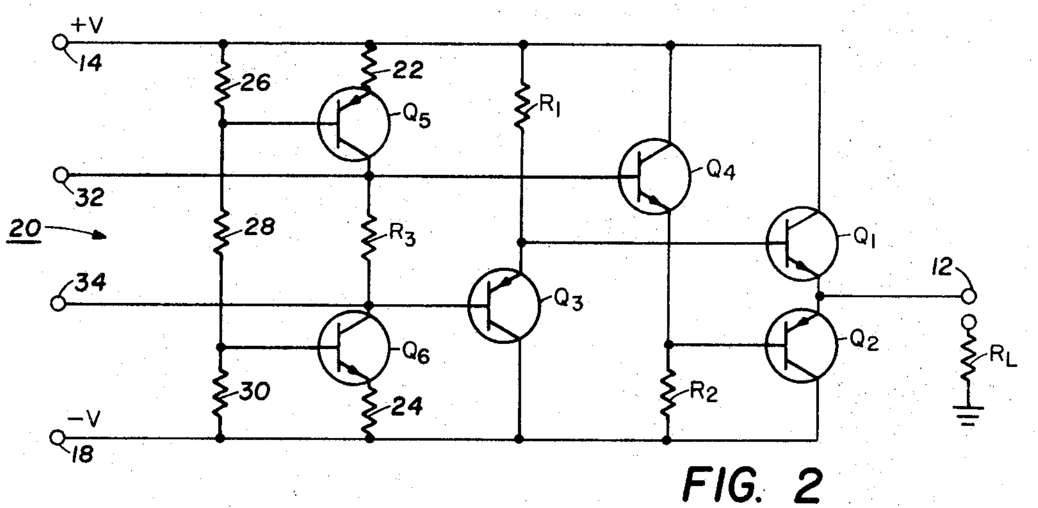
FIG. 2 is a schematic circuit diagram of another amplifier circuit constructed in accordance with the present invention.

In the circuit 10, the sum of the base-emitter voltages of transistors $Q_3$ and $Q_4$ is sufficiently large that the idle current through transistors $Q_1$ and $Q_2$ will usually be higher than needed for good linearity when resistors $R_1$ and $R_2$ are equal and assuming matched $V_{BE}$ characteristics of the similar transistors. Since it is usually desirable to reduce the idle current to the minimum practical for obtaining the desired degree of linearity, it is usually desirable to reduce the difference in potential of the bases of the output transistors $Q_1$ and $Q_2$. This is accomplished in the circuit indicated generally by the reference numeral 20 in FIG. 2 by connecting a voltage source between the bases of transistors $Q_3$ and $Q_4$. The voltage source may comprise a resistor $R_3$ and a constant current source and sink comprised of transistors $Q_5$ and $Q_6$ and the biasing network comprised of resistors 22, 24, 26, 28 and 30. The amplifier 20 also includes transistors $Q_1$, $Q_2$, $Q_3$ and $Q_4$ and resistors $R_1$ and $R_2$, all of which are interconnected in the same manner as in the amplifier circuit 10 except that the bases of transistors $Q_3$ and $Q_4$ are interconnected by the resistor $R_3$. The circuit 20 has two inputs 32 and 34 which may be used in the alternative as hereafter described. Resistor $R_3$ should have a value much smaller than the input impedance of either transistor $Q_3$ or $Q_4$. Resistors 22 and 24 should have equal values as should resistors 26 and 30. The values of the various resistors are selected so as to produce a constant current through the resistor $R_3$ at a level which will now be described.

The operation of the circuit 20 is fundamentally the same as the operation of the circuit 10. However, the effect of the constant current passing through resistor $R_3$ is to raise the potential at the base of transistor $Q_4$ and lower the potential at the base of transistor $Q_3$. This in turn increases the potential of the emitter of transistor $Q_4$ and therefore increases the potential of the base of transistor $Q_2$, and decreases the potential of the emitter of transistor $Q_3$ and the base of transistor $Q_1$. Thus, the effect of the constant voltage drop across the resistor $R_3$ is effective to reduce the difference in potential of the bases of transistors $Q_1$ and $Q_2$, and therefore reduces the idle current through the transistors. Accordingly, the value of resistor $R_3$ and the current through resistor $R_3$ should be chosen so as to reduce the difference in voltage between transistors $Q_1$ and $Q_2$ only to the extent necessary to reduce the idle current through these transistors to the minimum value compatible with good linearity. Transistors $Q_5$ and $Q_6$ may be considered as passive current sources, although transistor $Q_6$ acts as a current sink. This arrangement permits an input signal to be applied to either input terminal 32 or input terminal 34, in the alternative, to simultaneously raise or lower the potential of the bases of transistors $Q_3$ and $Q_4$ without affecting the voltage drop across the resistor $R_3$. Thus, an input signal applied to either input terminal 32 or 34, but not both, will produce an output at terminal 12 as heretofore described in connection with the amplifier circuit 10. Although the temperature coefficients of the base-emitter voltage characteristics of transistors $Q_3$ and $Q_4$ are slightly less than those of the output transistors $Q_1$ and $Q_2$, the overall operation of the amplifier is not affected by lowering the idle current to a more optimum level. Compensation of this difference in temperature coefficients can be obtained by selecting resistors with positive temperature coefficients for resistances $R_1$ and $R_2$. It will be appreciated by those skilled in the art that either transistor $Q_5$ or transistor $Q_6$ may be eliminated and a current sink substituted without materially affecting the operation of the circuit.

Figure 3:
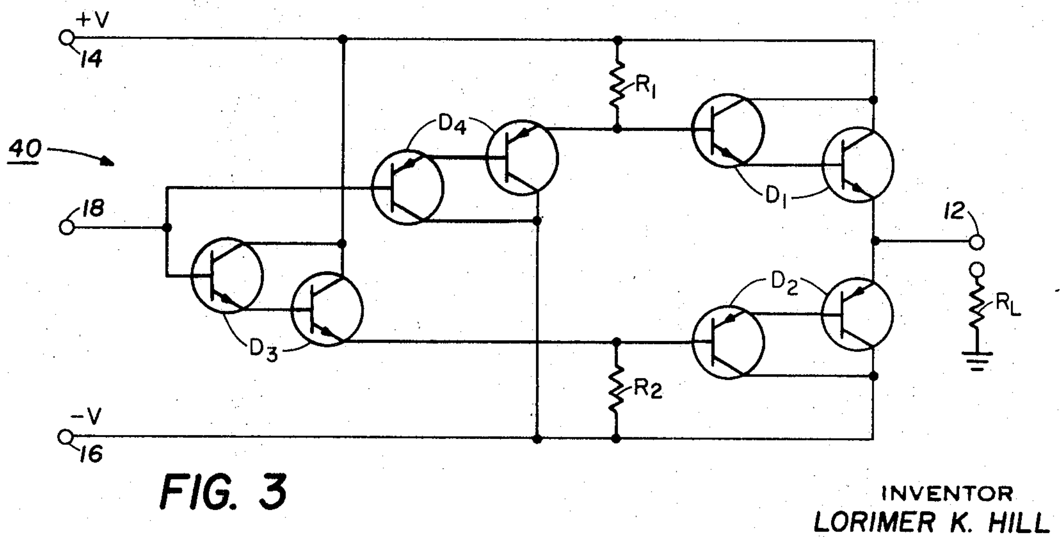
FIG. 3 is a schematic circuit diagram of yet another amplifier circuit constructed in accordance with the present invention.

Referring now to FIG. 3, another amplifier in accordance with this invention is indicated generally by the reference numeral 40. The amplifier 40 is identical to the amplifier 10 except that a Darlington pair of transistors is substituted for each of the transistors $Q_1$–$Q_4$ in order to substantially increase the current drive capability of the amplifier. For example, it will be noted that transistors $Q_1$–$Q_4$ are replaced by Darlington pairs $D_1$–$D_4$, respectively. All other components of the circuit remain the same and are designated by corresponding reference characters, and the operation of the circuit is virtually identical to the operation of the circuit 10, except for the increased current gain.

Figure 4:
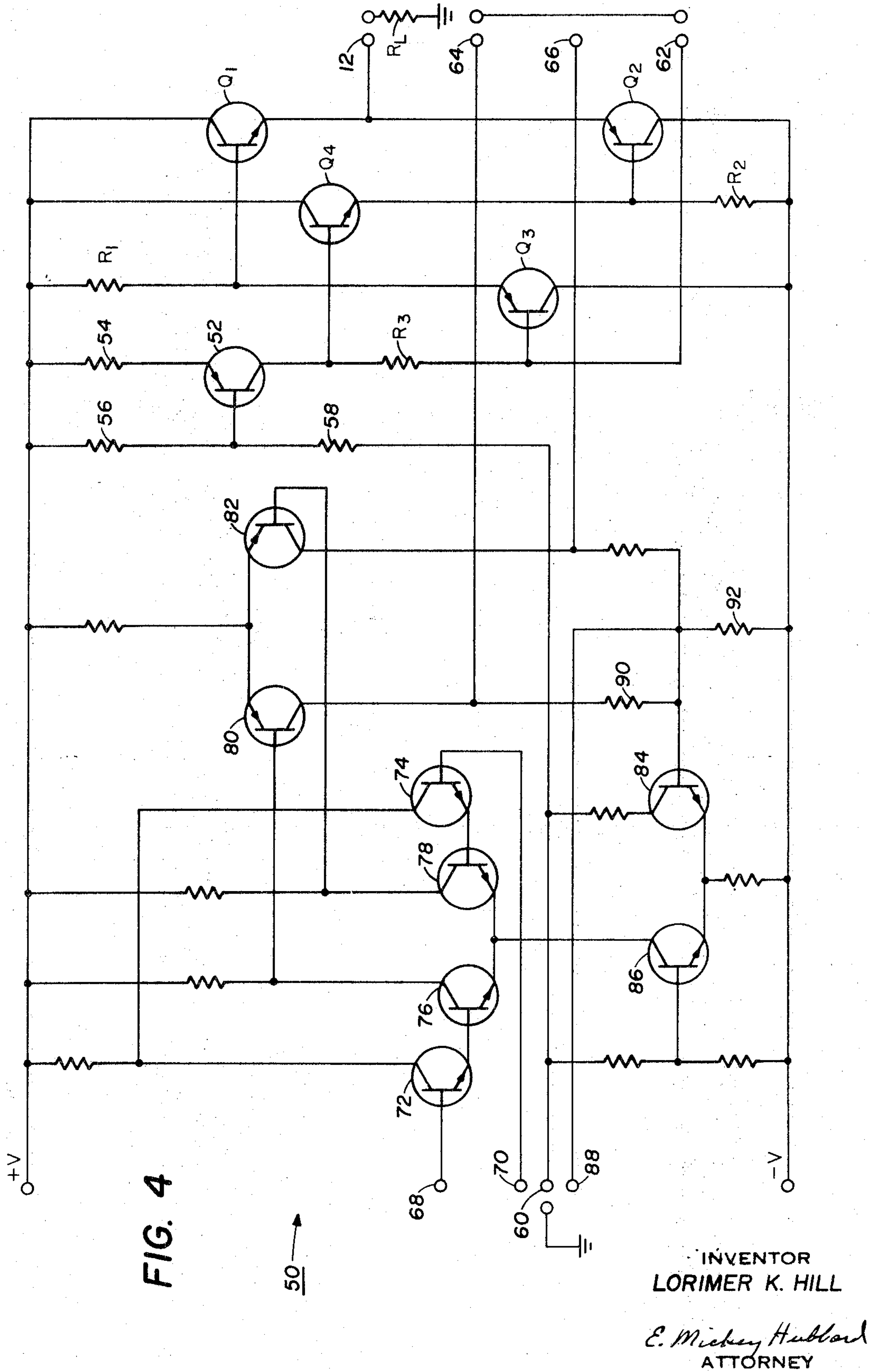
FIG. 4 is a schematic circuit diagram of still another amplifier circuit constructed in accordance with the present invention.

Referring now to FIG. 4, another amplifier circuit in accordance with this invention is indicated generally by the reference numeral 50. The amplifier 50 is at the present time sold commercially by the assignee of the present invention as a ten-terminal integrated circuit device. The circuit 10 has a class B amplifier section including the transistors $Q_1$, $Q_2$, $Q_3$ and $Q_4$ and resistors $R_1$, $R_2$ and $R_3$ connected as in the circuit 20. A constant current is passed through the resistor $R_3$ by a passive constant current source transistor 52 which is biased by resistors 54, 56 and 58, the resistor 58 being connected to the package output terminal 60 which is connected to ground during operation. Current passing through the resistor $R_3$ goes to output terminal 62 which is connected to a suitable current sink, i.e., either ground or one of the output terminals 64 or 66 of the differential amplifier stage presently to be described.

The amplifier 50 also has a conventional differential amplifier section having inputs 68 and 70 which are the bases of differentially connected emitter-follower impedance stages 72 and 74. The impedance stage 72 drives the bases of transistors 76 and 78 of a first differential amplifier stage. Transistors 80 and 82 form a second differential amplifier stage the collectors of which are connected to the output terminals 64 and 66. Transistor 84 completes a common mode rejection loop back to the current source transistor 86 of the first stage of the amplifier. The differential amplifier section is not, per se, a part of the present invention. Terminal 88 is a rolloff point for the common mode rejection loop.

The circuit 50 may be selectively operated either as a differential amplifier or as a class B amplifier. When operating the circuit 50 as a differential amplifier, the terminal 62 is grounded to sink the current from the source 52 through the resistor $R_3$ and operate the transistors $Q_1$–$Q_4$ of the class B stage at no-signal condition. Differential outputs 64 and 66 are then used to drive the load. However, when the circuit device 50 is to be used as a class B amplifier, the terminal 62 is connected either to differential output terminal 64 or 66. Assuming that terminal 62 is connected to terminal 64, the current sink for the current that passes through resistor $R_3$ is then the circuit including terminals 62 and 64 and resistos 90 and 92. When connected in this manner, the operation of the class B section of the amplifier is identical to the operation of the amplifier 20 heretofore described. With terminal 62 connected to output 64 of the differential amplifier section, the output at terminal 12 of the class B section will be in-phase with a signal applied to input terminal 68 of the differential amplifier, and 180° out-of-phase with a signal applied to input terminal 70. Conversely, if terminal 62 is connected to output terminal 66, then the class B output at terminal 12 will be in-phase with a signal applied to input terminal 70, and 180° out--of-phase with a signal applied to input terminal 68. If desired, the terminal 62 can be driven by any other signal source which also provides a suitable means for sinking the current through the resistor $R_3$.

Figure 5:
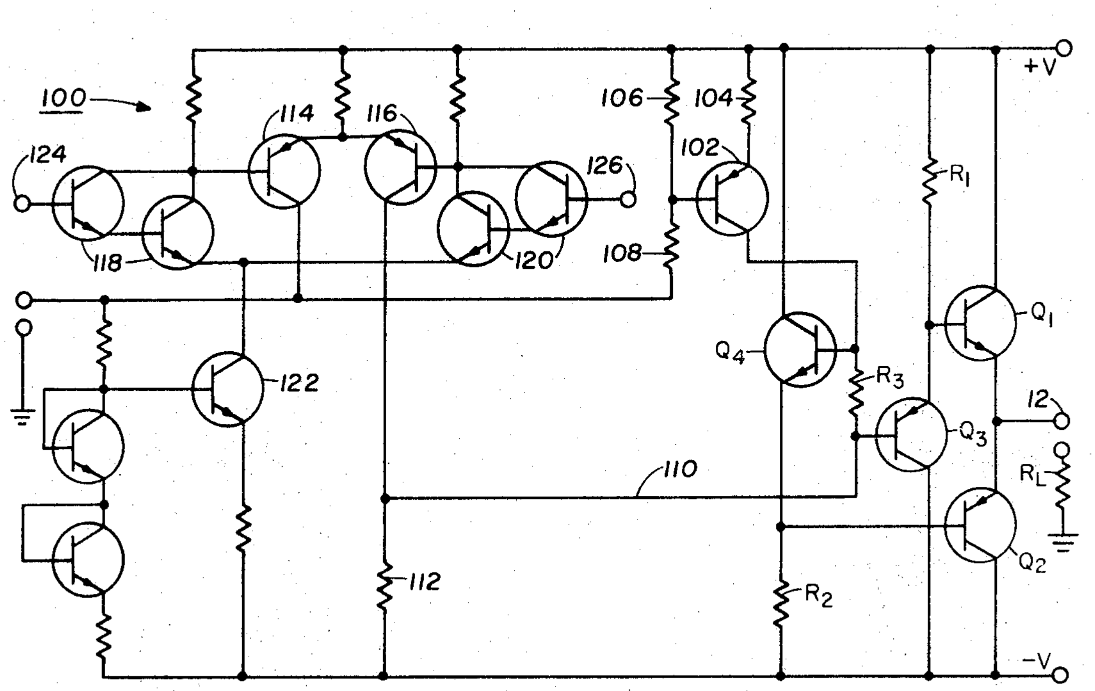
FIG. 5 is a schematic circuit diagram of yet another amplifier circuit constructed in accordance with the present invention.

Referring now to FIG. 5, another amplifier constructed in accordance with the present invention is indicated generally by the reference numeral 100. The amplifier 100 has a class B section substantially identical to that of the amplifier 50 which is comprised of transistors $Q_1$–$Q_4$, resistors $R_1$–$R_3$ and a current source transistor 102 which is biased by a resistor network comprised of resistors 104, 106 and 108. Conductor 110 provides a signal input to the class B section and also connects resistor $R_3$ to resistor 112 which acts as a current sink for current through resistor $R_3$. The class B section is driven by a differential amplifier stage comprised of transistors 114 and 116. Transistors 114 and 116 are driven by differently connected Darlington pair impedance stages 118 and 120, respectively. Transistor 122 in the associated biasing network provides a constant current source for the differential impedance stages. The differential amplifier has inputs 124 and 126. The operation of the class B amplifier section of the amplifier 100 is substantially identical with the operation of the amplifier 20 heretofore described. The signal at output terminal 12 of the class B amplifier section will be in-phase with the signal applied to the input 126, and will be 180° out-of-phase with a signal applied to the input 124. The operation of the differential amplifier section driving the class B section is conventional.

Figure 6:
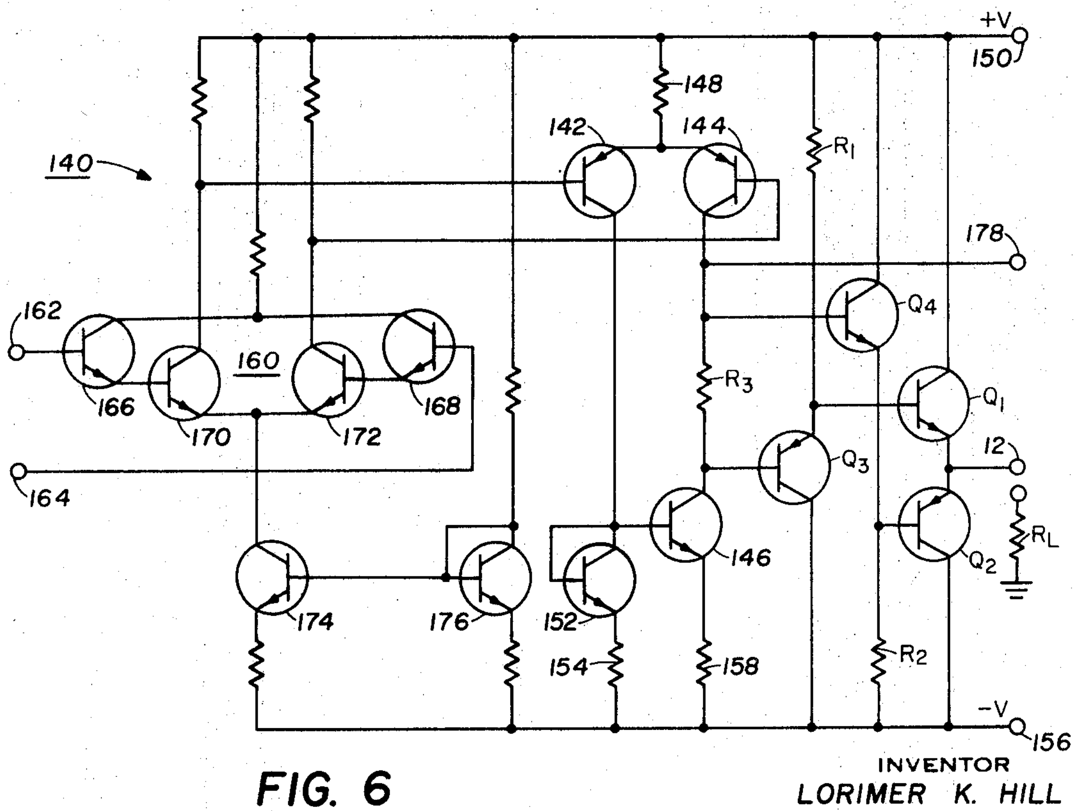
FIG. 6 is a schematic circuit diagram of still another amplifier circuit constructed in accordance with the present invention.

Referring now to FIG. 6, another amplifier device constructed in accordance with this invention is indicated generally by the reference numeral 140. The circuit 140 also includes the class B section comprised of transistors $Q_1$, $Q_2$, $Q_3$ and $Q_4$ and resistors $R_1$, $R_2$ and $R_3$. However, the constant current through the resistor $R_3$ is provided by an active current source comprised of differentially connected transistors 142 and 144, and transistor 146. The emitters of transistors 142 and 144 are connected through a resistor 148 to the positive voltage supply terminal 150. The collector of transistor 142 is connected through transistor 152, the collector and base of which are shorted to form a diode, and resistor 154 to the negative voltage terminal 156. The collector of transistor 144 is connected through the resistor $R_3$ to the collector of transistor 146, and the emitter of transistor 146 is connected through resistor 158 to the negative voltage supply terminal 156. The base of transistor 146 is connected to the collector of transistor 142. The bases of transistors 142 and 144 form the input to the class B section and are driven by the outputs of a differential voltage amplifying stage indicated generally by the reference numeral 160. The amplifier stage 160 has input terminals 162 and 164 which are connected to the bases of impedance stage transistors 166 and 168 which are differentially connected. The impedance stages drive differentially connected amplifier stages 170 and 172. Transistor 174 provides a constant current source for both the impedance and amplifier stages. Transistor 176 provides a reference voltage for the base of transistor 174.

Terminal 178 provides a rolloff point for the current source.

Under no-signal conditions, transistors 142 and 144 are biased such that the current passing through resistor $R_3$ produces the desired voltage drop to operate the class B section of the amplifier as heretofore described in connection with the amplifier 20. Assuming that input 164 is grounded, then when the input 162 goes positive, transistors 166 and 170 will conduct more current and transistors 168 and 172 less current, thus lowering the voltage at the collector of transistor 170 and raising the voltage at the collector of transistor 172. This increases the conductance of transistor 142 and decreases the conductance of transistor 144. As the conductance of transistor 142 increases, the conductance of transistor 146 also increases. Thus, as the conductance of transistor 144 decreases and the conductance of transistor 146 increases, the potentials of the bases of both transistors $Q_4$ and $Q_3$ are lowered by substantially the same amount. This decreases the conductance of transistor $Q_1$ and increases the conductance of transistor $Q_2$, thereby lowering the potential at the output terminal 12. Conversely, when the input terminal 162 goes negative with respect to the voltage at the other input terminal 164, the conductance of transistors 166 and 170 decreases and the conductance of transistors 168 and 172 increases, thereby decreasing the conductance of transistors 142 and 146 and increasing the conductance of transistor 144. This raises the potential of the bases of both transistors $Q_4$ and $Q_3$ and thereby causes the output terminal 12 of the class B section to go positive. Thus it will be noted that the current source which supplies current through the resistor $R_3$ is active with respect to the input signal supplied to the terminal 162 and provides a means for applying the input signal to input transistors $Q_3$ and $Q_4$. Since transistors 144 and 146 operate in a complementing mode, the current through the resistor $R_3$, and therefore the voltage drop across the resistor $R_3$, remains essentially constant.

From the above detailed description of several preferred embodiments of the invention, it will be appreciated that a complementary class B circuit has been provided which has a stable operation over a wide temperature range without crossover distortion and over a wide signal excursion without excessive idle current. Although preferred embodiments of the invention have been described in detail, it is to be understood that various changes, substitutions and alterations can be made in the various components and combinations thereof without departing from the spirit and scope of the invention as defined by the appended claims.

What is claimed is:

1. An amplifier circuit comprising in combination (a) an NPN output transistor and a PNP output transistor, with each having emitter, collector and base electrodes;

(b) an NPN emitter-follower input transistor and a PNP emitter-follower input transistor, with each having emitter, collector and base electrodes;

(c) input and output circuits; and (d) positive and negative voltage sources; wherein (e) the emitter electrodes of said NPN and PNP output transistors are D.C. connected together and D.C. connected to said output circuit; and wherein (f) the collector electrodes of said NPN and PNP output transistors are respectively D.C. connected to said positive and negative voltage sources; and wherein (g) the collector electrodes of said NPN and PNP emitter-follower input transistors are respectively D.C. connected to said positive and negative voltage sources; and wherein (h) the emitter electrode of said PNP emitter-follower input transistor is D.C. connected to said positive voltage source through a first resistor and D.C. connected to the base electrode of said NPN output transistor for respectively increasing and decreasing the conduction of said NPN output transistor when the conduction of said PNP emitter-follower input transistor respectively decreases and increases; and wherein (i) the emitter electrode of said NPN emitter-follower input transistor is D.C. connected to said negative voltage source through a second resistor and D.C. connected to the base electrode of said PNP output transistor for respectively increasing and decreasing the conduction of said PNP output transistor when the conduction of said NPN emitter-follower input transistor respectively decreases and increases; and wherein (j) the base electrodes of said NPN and PNP emitter-follower input transistors are D.C. connected to said input circuit and D.C. connected together by a third resistor for reducing the difference between the base-emitter voltages of said NPN and PNP emitter-follower input transistors when no signal is applied to said input circuit so as to minimize the conduction of said NPN and PNP emitter-follower input transistors in their linear regions; and wherein (k) a constant current source is connected to said third resistor for maintaining a constant voltage drop thereacross; and (l) the base-emitter voltages of said NPN and PNP emitter-follower input transistors respectively bias said PNP and NPN output transistors to different levels when no input signal is applied to said input circuit so as to respectively cause said PNP and NPN output transistors to conduct in their linear range.

2. The amplifier circuit of claim 1 wherein said constant current source includes (a) a PNP transistor having its collector electrode connected to one end of said third resistor and its emitter electrode connected to said positive voltage source through a fourth resistor; and (b) an NPN transistor having its collector electrode connected to the other end of said third resistor and its emitter electrode connected to said negative voltage source through a fifth resistor.

3. The amplifier circuit of claim 1 wherein (a) an NPN transistor is connected to each of said NPN input and output transistors so that its emitter and collector electrodes are connected across the base and collector electrodes of its respective NPN input and output transistor; and wherein (b) a PNP transistor is connected to each of said PNP input and output transistors so that its emitter and collector electrodes are connected across the base and collector electrode of its respective PNP input and output transistor; whereby (c) the current drive capability of said amplifier circuit is substantially increased.

References Cited

UNITED STATES PATENTS

| | | | |
|---|---|---|---|
| 2,955,257 | 10/1960 | Lindsay | 330—13 |
| 3,260,947 | 7/1966 | Dorsman | 330—17 |
| 3,312,833 | 4/1967 | Durrett | 330—17 |
| 3,418,589 | 12/1968 | Yee | 330—13 |

ROY LAKE, Primary Examiner

L. J. DAHL, Assistant Examiner

U.S. Cl. X.R.

330—17